United States Patent
Song et al.

(10) Patent No.: US 7,528,650 B2
(45) Date of Patent: May 5, 2009

(54) MULTI-CHANNEL DIGITAL AMPLIFIER, SIGNAL PROCESSING METHOD THEREOF, AND AUDIO REPRODUCING SYSTEM HAVING THE SAME

(75) Inventors: Young-suk Song, Suwon-si (KR); Hee-soo Lee, Suwon-si (KR); Hae-kwang Park, Suwon-si (KR); Zhun-woo Kim, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 119 days.

(21) Appl. No.: 11/591,505

(22) Filed: Nov. 2, 2006

(65) Prior Publication Data
US 2007/0170983 A1 Jul. 26, 2007

(30) Foreign Application Priority Data
Jan. 20, 2006 (KR) .................... 10-2006-0006290

(51) Int. Cl.
*H03F 3/38* (2006.01)
(52) U.S. Cl. ...................................... 330/10
(58) Field of Classification Search ................ 330/10; 375/238; 370/212
See application file for complete search history.

(56) References Cited

U.S. PATENT DOCUMENTS

| | | | |
|---|---|---|---|
| 5,579,395 A | 11/1996 | Horl | |
| 6,680,972 B1 | 1/2004 | Liljeryd et al. | |
| 2003/0093271 A1 | 5/2003 | Tsushima et al. | |
| 2004/0028243 A1* | 2/2004 | Seo et al. | 381/97 |
| 2005/0060146 A1 | 3/2005 | Oh | |
| 2007/0213083 A1* | 9/2007 | Shaanan | 455/500 |

FOREIGN PATENT DOCUMENTS

| | | |
|---|---|---|
| JP | 2002-111399 | 4/2002 |
| KR | 2002-92750 | 12/2002 |
| KR | 2003-15764 | 2/2003 |

OTHER PUBLICATIONS

Korean Office Action dated Dec. 12, 2006 issued in KR 2006-6290.
Dutch Search Report dated May 9, 2006 issued in NL 1029619.

* cited by examiner

*Primary Examiner*—Steven J Mottola
(74) *Attorney, Agent, or Firm*—Stanzione & Kim, LLP

(57) ABSTRACT

A multi-channel digital amplifier system to generate a pulse width modulation (PWM) signal having a different switching frequency in each channel, and a signal processing method thereof. The digital amplifier system includes a PWM conversion unit to convert a plurality of audio signals on a plurality of channels into low output power PWM signals having switching frequencies that are different from each other, a switching circuit unit to amplify the plurality of low output power PWM signals to a plurality of high power output PWM signals on the respective channels, and a filter unit to restore the plurality of high output power PWM signals to a plurality of analog audio signals on the respective channels.

14 Claims, 6 Drawing Sheets

MULTI-CHANNEL DIGITAL AMPLIFIER, SIGNAL PROCESSING METHOD THEREOF, AND AUDIO REPRODUCING SYSTEM HAVING THE SAME

CROSS-REFERENCE TO RELATED APPLICATIONS

This application claims the benefit of Korean Patent Application No. 10-2006-0006290, filed on Jan. 20, 2006, in the Korean Intellectual Property Office, the disclosure of which is incorporated herein in its entirety by reference.

BACKGROUND OF THE INVENTION

1. Field of the Invention

The present general inventive concept relates to a multi-channel digital amplifier system, and more particularly, to a multi-channel digital amplifier system to generate a pulse width modulation (PWM) signal having a different switching frequency in each channel, and a signal processing method thereof.

2. Description of the Related Art

Generally, a digital amplifier pulse-width modulates a digital signal with a smaller amplitude, such as a pulse code modulation (PCM) signal, to generate a PWM signal. The digital amplifier amplifies the PWM signal to have a large amplitude by using a semiconductor switching device, such as a field effect transistor (FET). Then, an audio signal is extracted from the amplified PWM signal by using a low pass filter.

This digital amplifier may use only a single channel for mono sound, but in most cases, uses multi channels with two or more channels, such as 5.1 channels or 7.1 channels.

Figure 1:
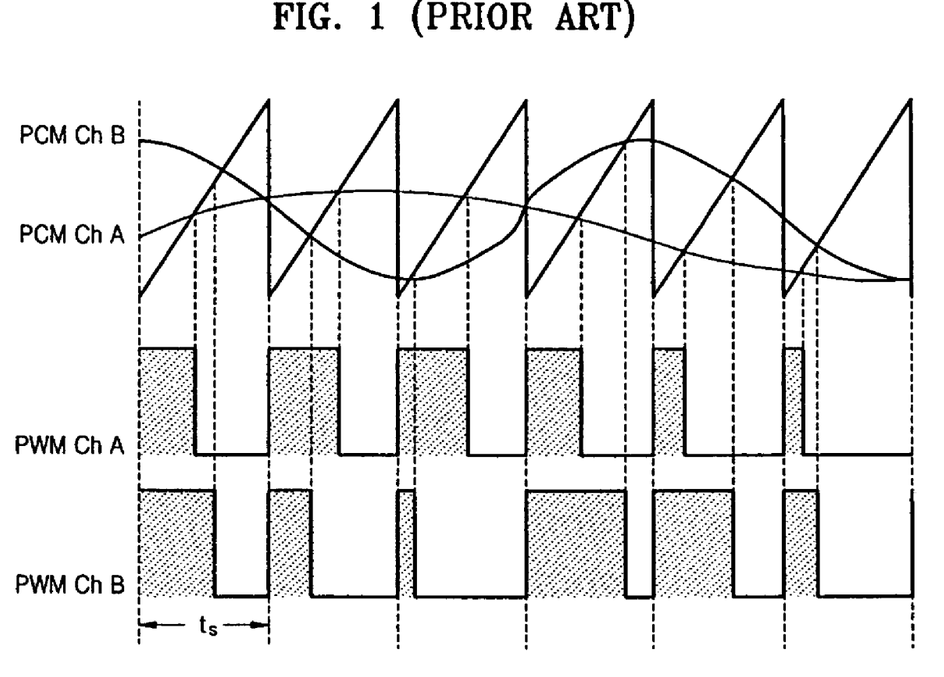
FIG. 1 illustrates waveforms of a conventional pulse width modulation (PWM) signal of a conventional digital amplifier.
Figure 2:
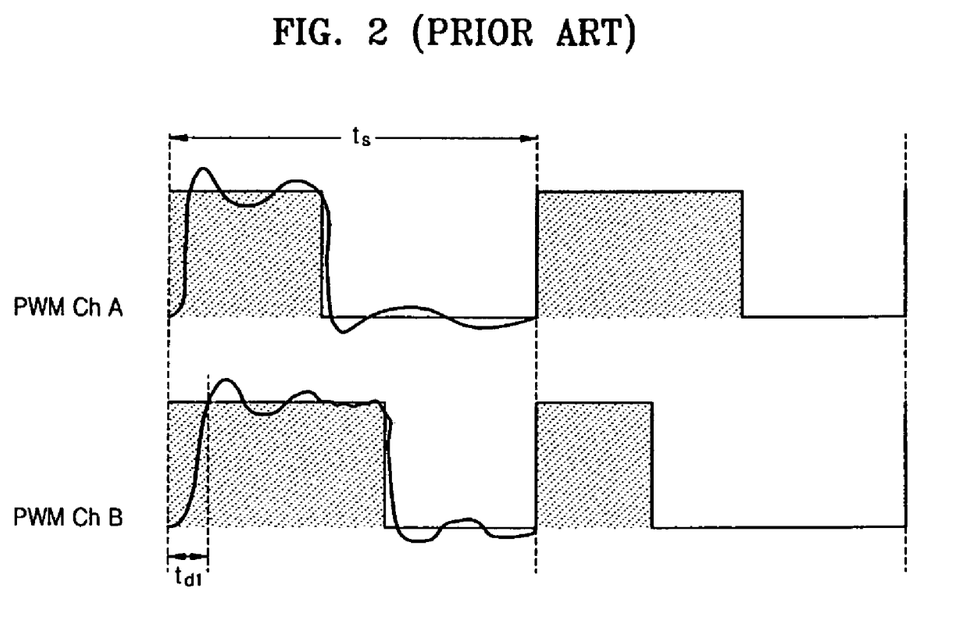
FIG. 2 illustrates waveforms of a conventional power-amplified PWM signal.

A conventional multi-channel digital amplifier will now be explained briefly. FIG. 1 illustrates waveforms of a conventional pulse width modulation (PWM) signal of the digital amplifier system. FIG. 2 illustrates waveforms of a conventional power-amplified PWM signal. First, a number of PWM signals (i.e., the number corresponds to a number of channels) are output through a PWM modulator. These output PWM signals are converted into N high output power PWM signals by N switching devices, respectively. At this time, the PWM modulator generates the PWM signals in respective channels by applying identical switching frequencies to all channels regardless of the number of channels, as illustrated in the waveform diagram of FIG. 1. That is, referring to FIG. 1, the PWM switching frequency of channel A and the PWM switching frequency of channel B are identical. In this case, the switching frequency can be determined by rising edges of the PWM Ch A and the PWM Ch B signals. As can be seen from FIG. 1, the rising edges of the PWM Ch A and PWM Ch B signals occur at the same point in time.

Referring to PWM Ch A and PWM Ch B of FIG. 1, although the channels are different, the identical PWM switching frequencies cause switching time points in the switching devices to occur at a high rate. However, if power is turned on or off at the same time at two or more channels, a power source unit experiences an overload such that power source noise is generated.

Additionally, as illustrated in FIG. 2, in the actual waveforms of the PWM signals amplified in the switching devices, a propagation delay time ($t_{d1}$) exists at a time when the switching device is turned on or off. However, as illustrated in FIG. 2, if the switching device of channel B is turned on at a time close to the time when the switching device of channel A is turned on, the propagation delay time ($t_{d1}$) of the switching device increases or decreases abnormally such that the waveform of the amplified PWM signal finally output is distorted.

SUMMARY OF THE INVENTION

The present general inventive concept provides a multi-channel digital amplifier system that reduces crosstalk and noise components between channels by generating PWM signals in the respective channels having switching frequencies that are different from each other.

The present general inventive concept also provides a signal processing method of generating PWM signals in respective channels having switching frequencies that are different from each other in a multi-channel digital amplifier system.

Additional aspects of the present general inventive concept will be set forth in part in the description which follows and, in part, will be obvious from the description, or may be learned by practice of the general inventive concept.

The foregoing and/or other aspects of the present general inventive concept are achieved by providing a digital amplifier system including a pulse code modulation (PWM) conversion unit to convert a plurality of audio signals into low output power PWM signals having switching frequencies that are different from each other, a switching circuit unit to amplify the plurality of low output power PWM signals to a plurality of high power output PWM signals on the respective channels, and a filter unit to restore the plurality of high output power PWM signals to a plurality of analog audio signals on the respective channels.

The foregoing and/or other aspects of the present general inventive concept are also achieved by providing a digital amplifier, including a pulse width modulation (PWM) conversion unit to receive pulse code modulation (PCM) audio data for a plurality of channels and to convert the PCM audio data into corresponding pulse width modulation (PWM) signals having different frequencies.

The foregoing and/or other aspects of the present general inventive concept are also achieved by providing a digital amplifier usable in an audio reproducing system, the amplifier including a pulse width modulation conversion unit to receive information about a plurality of channels and a plurality of audio data signals on the respective channels, and to generate a plurality of PWM signals on the respective channels based on time value comparisons between the plurality of audio data signals and a plurality of pulse reference signals associated with the received channel information.

The foregoing and/or other aspects of the present general inventive concept are also achieved by providing a digital amplifier, including a PWM conversion unit to receive first and second pulse code modulation (PCM) signals, to compare time values of the first and second PCM signals to first and second preset high frequency reference signals, and to generate first and second pulse width modulation (PWM) signals based on the respective comparisons.

The foregoing and/or other aspects of the present general inventive concept are also achieved by providing an audio reproducing system, the system including a digital amplifier having a pulse width modulation (PWM) conversion unit to receive pulse code modulation (PCM) audio data for a plurality of channels and to convert the PCM audio data into corresponding pulse width modulation (PWM) signals having different frequencies, and a plurality of output units to output a plurality of analog audio signals derived from the PWM signals of the respective channels.

The foregoing and/or other aspects of the present general inventive concept are also achieved by providing a method of processing a signal in a digital amplifier system, the method including determining switching frequencies that are different from each other in a plurality of channels, converting a plurality of input audio signals into low output power PWM signals having the determined switching frequencies that are different from each other on the respective channels, amplifying the plurality of the generated low output power PWM signals to a plurality of high power output PWM signals in the respective channels, and restoring the plurality of the amplified high output power PWM signals to a plurality of analog audio signals in the respective channels.

BRIEF DESCRIPTION OF THE DRAWINGS

These and/or other aspects of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
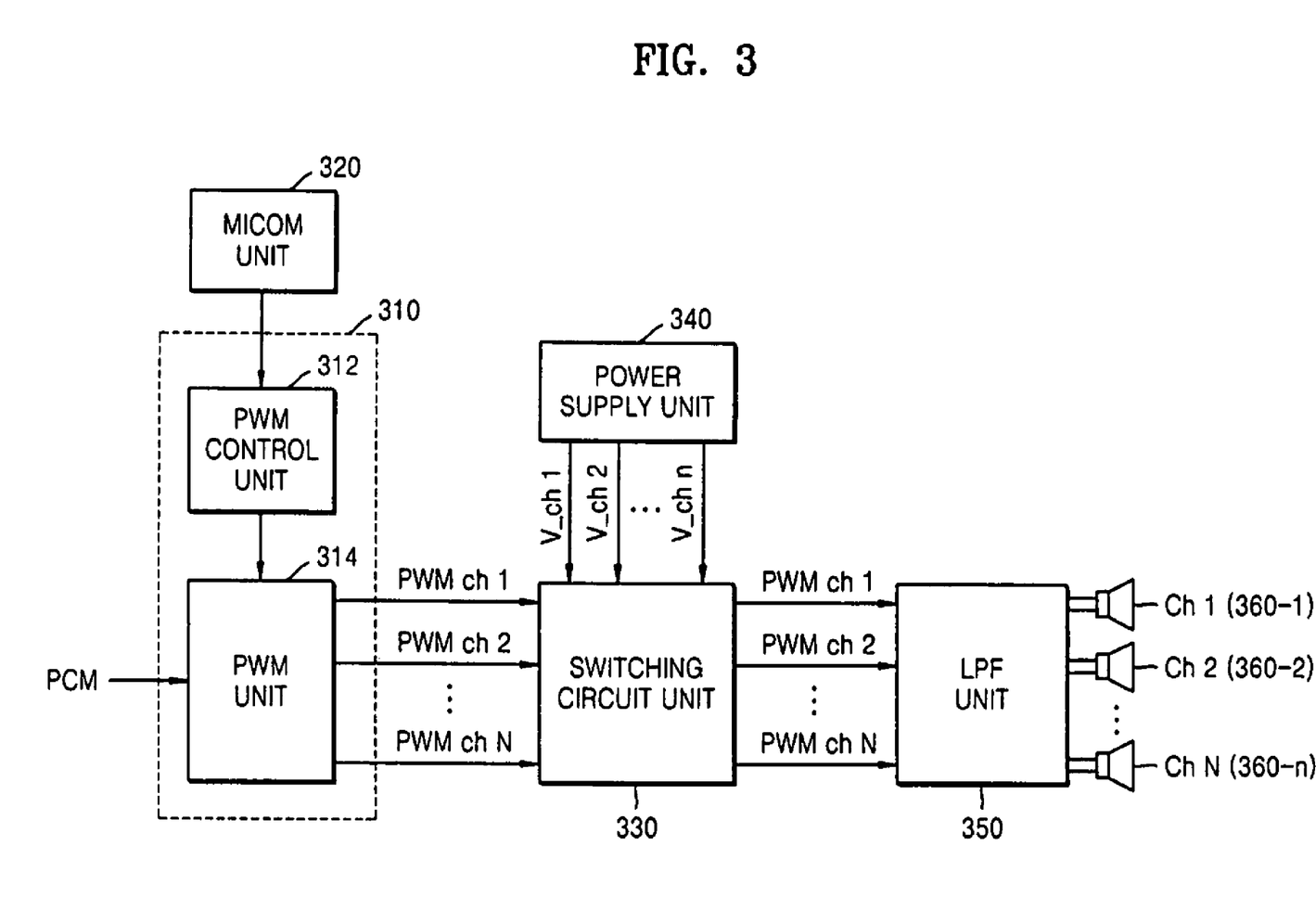
FIG. 3 is a block diagram illustrating a multi-channel digital amplifier system according to an embodiment of the present general inventive concept.

FIG. 3 is a block diagram illustrating a multi-channel digital amplifier system according to an embodiment of the present general inventive concept The digital amplifier system of FIG. 3 includes a PWM conversion unit 310, a micom (microcomputer) unit 320, a switching circuit unit 330, a power supply unit 340, and a low pass filter (LPF) unit 350. The PWM conversion unit 310 includes a PWM control unit 312 and a PWM unit 314. The switching circuit unit 330 includes a plurality of switching devices corresponding to multiple channels.

First, an input analog audio signal is converted into pulse code modulation (PCM) audio data by a digital signal processor (DSP) (not illustrated).

The micom unit 320 generates control signals to control blocks and/or components of the multi-channel digital amplifier system, such as function control and initialization. Additionally, the micom unit 320 provides channel information of the system, such as a number of channels, to the PWM control unit 312.

According to the channel number information provided by the micom unit 320, the PWM conversion unit 310 converts input PCM audio data into low output power PWM signals having different switching frequencies.

More specifically, in the PWM conversion unit 310, the PWM control unit 312 determines PWM switching frequencies that are different from each other in the respective channels according to the channel number information received from the micom unit 320. For example, if the number of the channels is determined to be two, the PWM control unit 312 may determine a switching frequency of channel A as 384 KHz and a switching frequency of channel B as 432 KHz. According to the PWM switching frequencies determined for the respective channels by the PWM control unit 312, the PWM unit 314 may convert the input PCM audio data into the PWM signals by using an ordinary digital amplification PCM technique. In the present embodiment, if the switching frequency information of each channel is input from the PWM control unit 312, the PWM unit 314 compares a level of the input audio signals in each channel with a level of a reference high frequency signal set differently for each channel. Based on this comparison, the PWM unit 314 generates the PWM signals in the respective channels having the switching frequencies that are different from each other.

The power supply unit 340 provides operational power to the switching devices for the respective channels in the switching circuit unit 330.

The switching circuit unit 330 power-amplifies low output power PWM signals of the N channels, which are converted by the PWM conversion unit 310, to high output power PWM signals with power provided by the power supply unit 340. For example, the switching circuit unit 330 may amplify about 3.3V low output power PWM signals to between 5V and 40V high output power PWM signals.

The LPF unit 350 low-pass filters each of the N channel signals using inductors (L) and capacitors (C). By removing high frequency components of the high output power PWM signals in the N channels amplified by the switching circuit unit 330, the LPF unit 350 restores N channel analog audio signals.

Finally, the audio signals of the respective channels restored by the LPF unit 350 are output to speakers 360-1 through 360-n, which correspond to the respective N channels.

Figure 4:
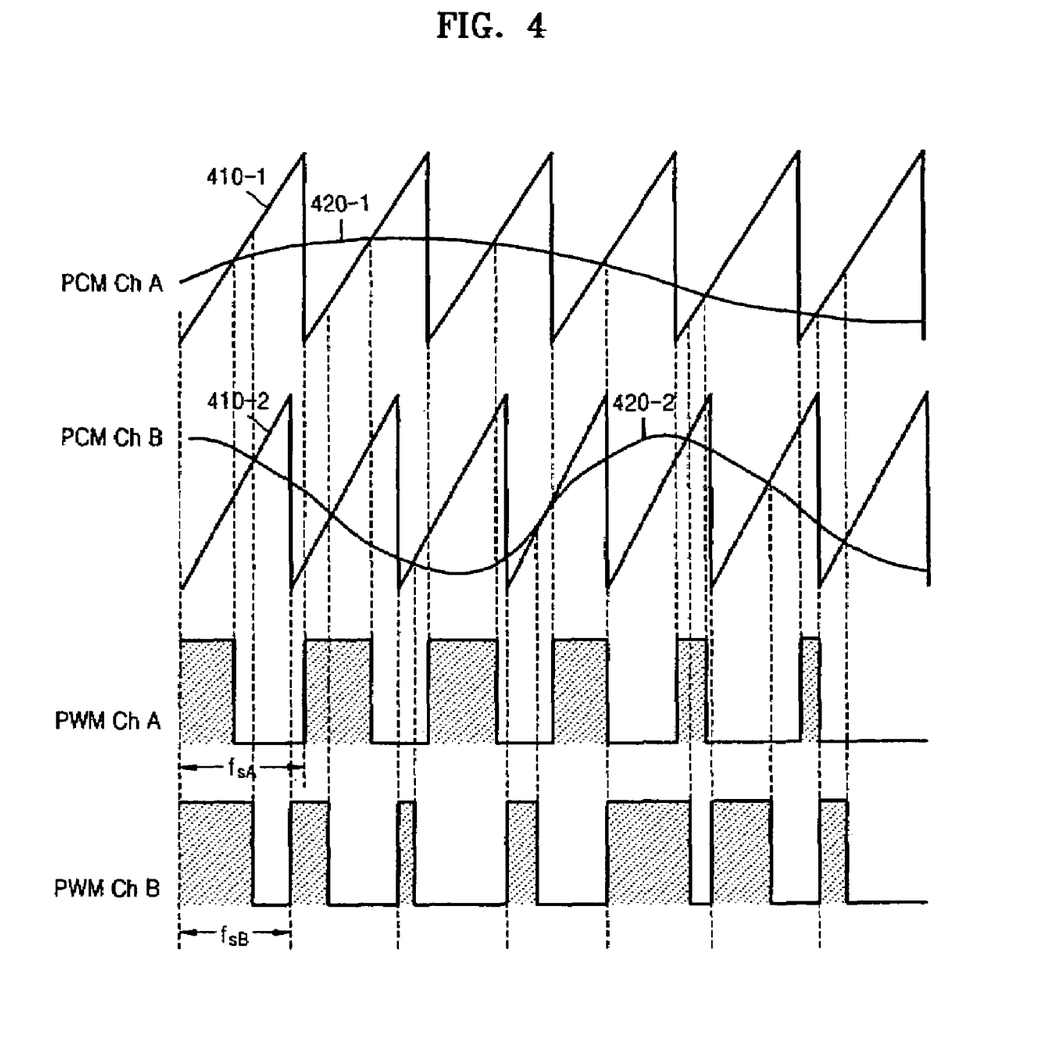
FIG. 4 illustrates operational waveforms of a PWM conversion unit of the multi-channel digital amplifier system of FIG. 3.

FIG. 4 illustrates operational waveforms of the PWM conversion unit 310 of FIG. 3.

Referring to FIG. 4, the PWM signals in channel A and channel B are generated to have different frequencies ($f_{SA}$) and ($f_{SB}$), respectively, by using preset reference high frequency signals. The different frequencies ($f_{SA}$) and ($f_{SB}$) can be determined in FIG. 4 by the respective rising edges of the PWM signals. The PCM signal of channel A 420-1 is converted into a PWM signal (i.e., PWM Ch A) by using a first reference high frequency signal 410-1, and the PCM signal of channel B 420-2 is converted into a PWM signal (i.e., PWM Ch B) by using a second reference high frequency signal 410-2. That is, the first reference high frequency signal 410-1 is compared with the level of the input PCM signal 420-1. If the PCM signal 420-1 is greater than the first reference high frequency signal 410-1, a high logic level is output. If the PCM signal 420-1 is less than the first reference high frequency signal 410-1, a low logic level (1) is output. Also, the second reference high frequency signal 410-2 is compared with the level of the input PCM signal 420-2. If the PCM signal 420-2 is greater than the second reference high frequency signal 410-2, a high logic level is output. If the PCM signal 420-2 is less than the second reference high frequency signal 410-2, a low logic level is output. Accordingly, the PWM conversion unit 310 generates the switching frequency ($f_{SA}$) of the PWM signal of channel A and the switching frequency ($f_{SB}$) of the PWM signal of channel B such that the switching frequencies are different from each other.

Figure 5:
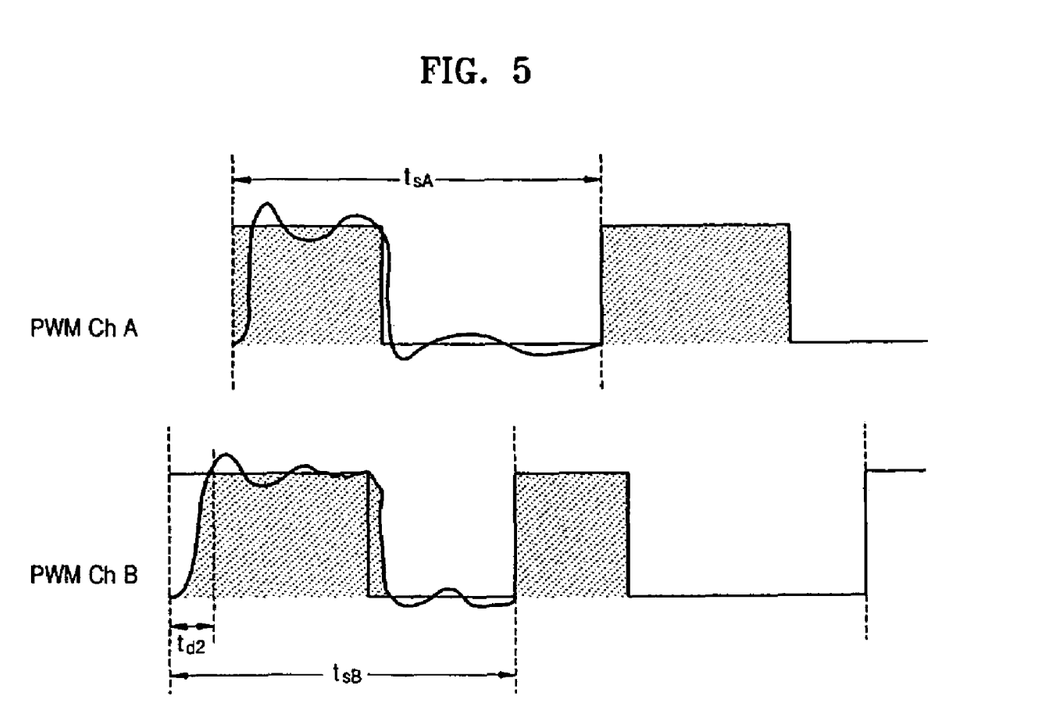
FIG. 5 illustrates waveforms of a PWM signal amplified in a switching circuit unit of the multi-channel digital amplifier system of FIG. 3.

FIG. 5 illustrates waveforms of a PWM signal output from the PWM conversion unit 310 of FIG. 3.

FIG. 5 illustrates the actual waveforms of PWM signals having the different switching frequencies with respect to the channels A and B. A propagation delay time ($t_{d2}$) exists between the PWM signals on the channels A and B. Referring to FIG. 5, if the switching frequencies of the respective channels are different, a time when the switching device (i.e., of the switching circuit unit 330) of the channel A is turned on is different from a time when the switching device (i.e., of the switching circuit unit 330) of the channel B is turned on such that an abnormally rapid increase or decrease in the propagation delay time ($t_{d2}$) of a switching device does not occur. In FIG. 5, ($t_{SA}$) indicates a period of the PWM signal on channel A, and ($t_{SB}$) indicates a period of the PWM signal on channel B.

Figure 6:
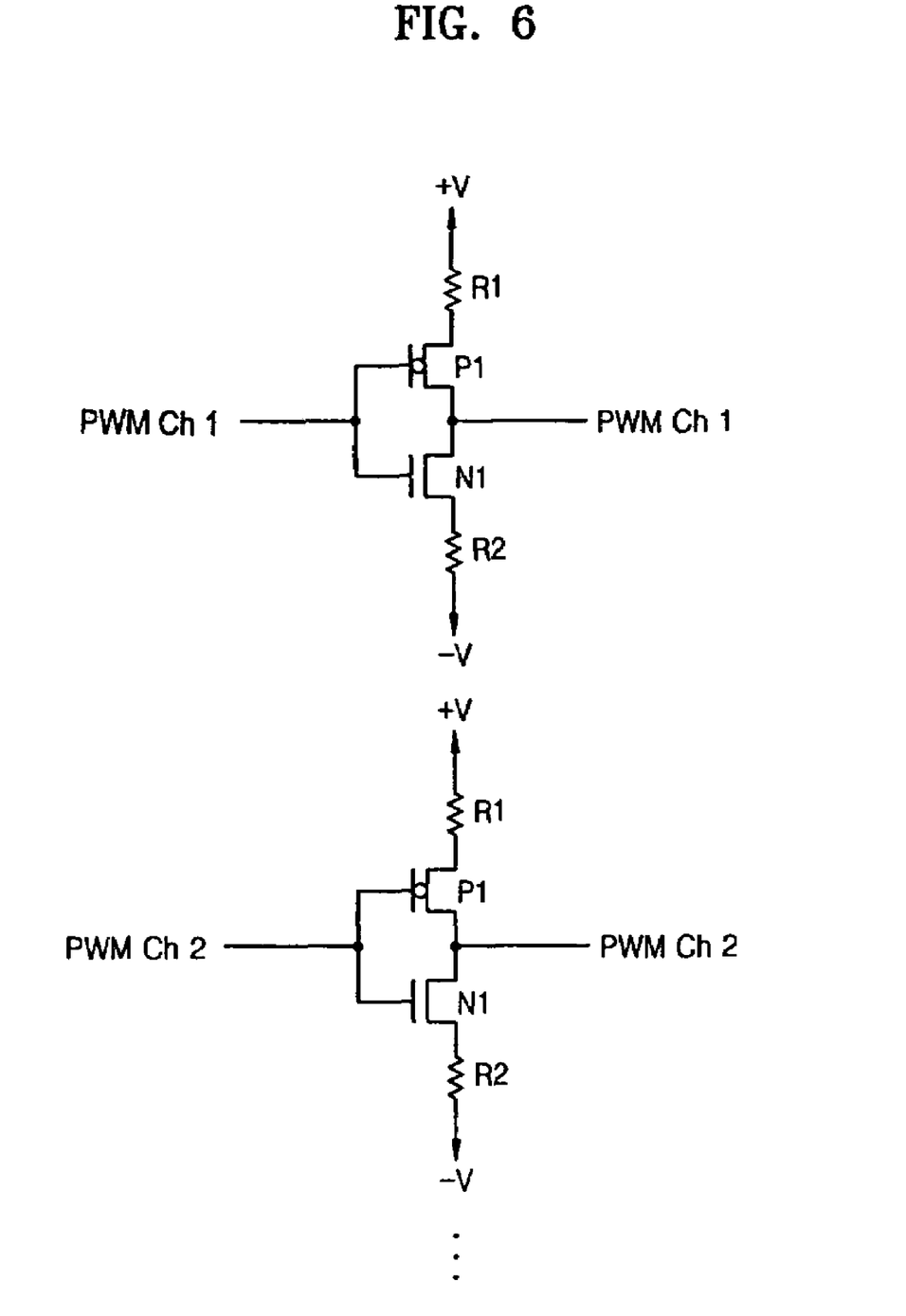
FIG. 6 is a diagram illustrating a switching circuit unit according to an embodiment of the present general inventive concept.

FIG. 6 is a diagram illustrating the switching circuit unit 330 of FIG. 3 according to an embodiment of the present general inventive concept.

In each channel of the switching circuit unit 330 a switching device including a PMOS transistor (P1) and an NMOS transistor (N1) is disposed in parallel. For example, in one channel, the PMOS transistor (P1) having a power source voltage (+V) connected to a source terminal thereof is switched according to a first channel PWM signal (PWM Ch1) of the PWM conversion unit 310. Also, the NMOS transistor (N1) having a drain terminal thereof connected to a drain terminal of the PMOS transistor (P1) and a source terminal connected to a ground voltage (−V) is switched according to the first channel PWM signal (PWM Ch1). Here, +V and −V are voltages supplied from a voltage source (e.g., the power supply unit 340). Also, R1 and R2 are resistances disposed in a conductor that connects the voltage source and the switching transistors.

Figure 7:
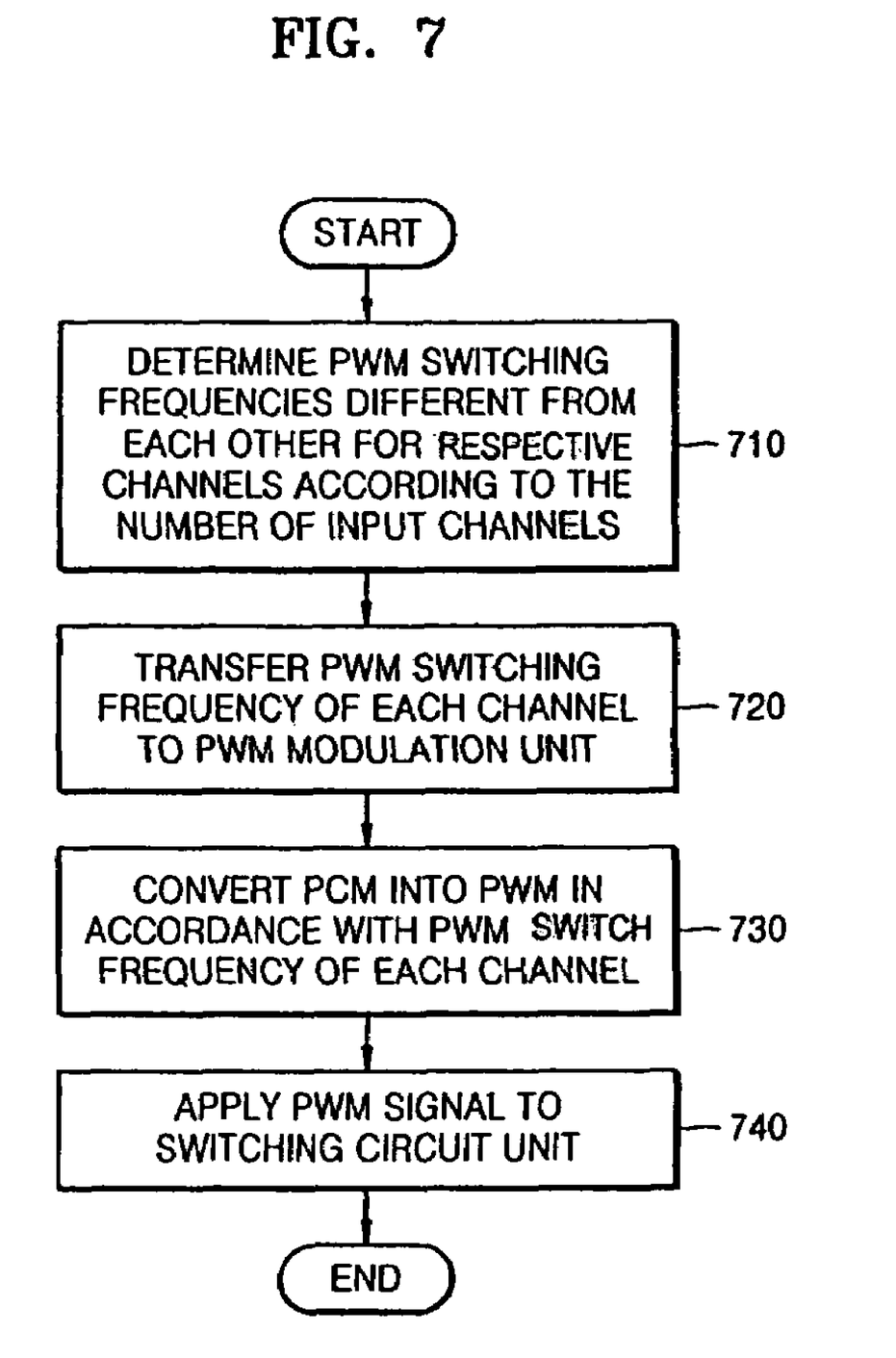
FIG. 7 is a flowchart illustrating a method of processing a signal of a digital amplifier according to an embodiment of the present general inventive concept.

FIG. 7 is a flowchart illustrating a method of processing a signal of a digital amplifier according to an embodiment of the present general inventive concept. The method of FIG. 7 may be performed by the system of FIG. 3. Accordingly, for illustration purposes, the method of FIG. 7 is described below with reference to FIGS. 3 to 6.

First, according to a number of channels, PWM switching frequencies in the respective channels that are different from each other are determined in operation 710.

Then, switching frequency information that are different from each other in the respective channels are transferred to the PWM unit 314 in operation 720.

By applying the switching frequencies set in the respective channels to a plurality of input audio signals, the audio signals are converted into PWM signals having different switching frequencies in operation 730.

Then, by applying the PWM signals to the switching circuit unit 330, the low output power PWM signals of the plurality of channels are amplified to generate the high output PWM signals in operation 740.

Finally, the amplified high output power PWM signals of the plurality of channels are restored to a plurality of analog audio channel signals.

The present general inventive concept can be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

According to the various embodiments of the present general inventive concept as described above, PWM signals having different switching frequencies in respective channels are used in a multi-channel digital amplifier system, such as a 5.1-channel or 7.1-channel system. Accordingly, a case in which switching devices in two or more channels are turned on at the same time occurs much less frequently such that crosstalk between channels can be reduced. Also, since a harmonic component of the switching frequency occurring in each channel is different from each other, a characteristic of electromagnetic interference can be reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A digital amplifier system, comprising:
a pulse width modulation (PWM) conversion unit to convert a plurality of audio signals received on a plurality of channels into low output power PWM signals having switching frequencies that are different from each other;
a switching circuit unit to amplify the plurality of low output power PWM signals on the plurality of channels to a plurality of high power output PWM signals; and
a filter unit to restore the high output power PWM signals on the respective channels amplified in the switching circuit unit to a plurality of analog audio signals on the respective channels.

2. The system of claim 1, wherein the PWM conversion unit comprises:
a PWM control unit to determine frequencies that are different from each other in the respective channels according to the number of channels; and
a PWM unit to modulate input audio signals into PWM signals having the different switching frequencies in the respective channels according to the switching frequencies determined by the PWM control unit.

3. The system of claim 2, wherein the PWM unit generates the PWM signals having the switching frequencies that are different from each other in the respective channels by comparing a level of a reference high frequency signal set differently for each channel with a level of the input audio signal in each channel.

4. The system of claim 1, further comprising:
a micom unit to provide channel number information to the PWM conversion unit.

5. The system of claim 1, wherein the switching circuit unit comprises:
a plurality of switching devices to turn on/off the low output power PWM signals output from the PWM conversion unit, the switching devices having the switching frequencies that are different from each other in the respective channels.

6. A digital amplifier usable in an audio reproducing system, the amplifier comprising:
a pulse width modulation conversion unit to receive information about a plurality of channels and a plurality of audio data signals on the respective channels, and to generate a plurality of pulse width modulation (PWM) signals on the respective channels based on time value comparisons between the plurality of audio data signals and a plurality of pulse reference signals associated with the received channel information.

7. The digital amplifier of claim 6, further comprising:
a micom unit to provide the received channel information to the pulse width modulation conversion unit including the pulse reference signals, which are preset.

8. The digital amplifier of claim 7, wherein the plurality of pulse reference signals have frequencies different from each other in the respective channels.

9. A digital amplifier, comprising:
a pulse width modulation (PWM) conversion unit to receive first and second pulse code modulation (PCM) signals, to compare time values of the first and second PCM signals to first and second preset high frequency reference signals, and to generate first and second pulse width modulation (PWM) signals based on the respective comparisons.

10. The digital amplifier of claim 9, wherein the first and second preset high frequency reference signals comprise sawtooth waves.

11. The digital amplifier of claim 9, wherein the first and second preset high frequency reference signals have frequencies different from each other.

12. A method of processing a signal in a digital amplifier system, the method comprising:
determining switching frequencies that are different from each other for a plurality of channels;
converting a plurality of input audio signals received on the respective channels into low output power PWM signals having the determined switching frequencies that are different from each other on the respective channels;
amplifying the low output power PWM signals on the respective channels to a plurality of high power output PWM signals; and
restoring the amplified high output power PWM signals on the respective channels to a plurality of analog audio signals.

13. A method of processing a signal in a digital amplifier system, the method comprising:
receiving information about a plurality of channels and a plurality of audio data signals on the respective channels; and
generating a plurality of pulse width modulation (PWM) signal: on the respective channels based on time value comparisons between the plurality of audio data signals and a plurality of pulse reference signals associated with the received channel information.

14. A method of processing a signal in a digital amplifier system, the method comprising:
receiving first and second pulse code modulation (PCM) signals;
comparing time values of the first and second PCM signals to first and second preset high frequency reference signals; and
generating first and second pulse width modulation (PWM) signals based on the respective comparisons.

* * * * *